(12) United States Patent
Kumazaki et al.

(10) Patent No.: US 8,976,606 B2
(45) Date of Patent: Mar. 10, 2015

(54) VOLTAGE GENERATING CIRCUIT AND SEMICONDUCTOR DEVICE INCLUDING THE VOLTAGE GENERATING CIRCUIT

(71) Applicant: Kabushiki Kaisha Toshiba, Tokyo (JP)

(72) Inventors: Noriyasu Kumazaki, Kanagawa (JP); Masafumi Uemura, Kanagawa (JP); Tatsuro Midorikawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 179 days.

(21) Appl. No.: 13/783,055

(22) Filed: Mar. 1, 2013

(65) Prior Publication Data
US 2013/0322180 A1    Dec. 5, 2013

(30) Foreign Application Priority Data

May 29, 2012  (JP) ................................. 2012-122513

(51) Int. Cl.
| | | |
|---|---|---|
| *G11C 5/14* | (2006.01) | |
| *G05F 3/02* | (2006.01) | |
| *G11C 16/06* | (2006.01) | |
| *G11C 11/4074* | (2006.01) | |

(52) U.S. Cl.
CPC *G05F 3/02* (2013.01); *G11C 16/06* (2013.01); *G11C 11/4074* (2013.01); *G11C 5/147* (2013.01); *G11C 5/145* (2013.01)
USPC ........ 365/189.09; 365/63; 365/226; 327/536; 327/537; 330/127; 330/297

(58) Field of Classification Search
CPC .... G11C 5/145; G11C 5/147; G11C 11/4074; G11C 16/06
USPC ......... 365/63, 189.09, 189.11, 211, 212, 226, 365/230.06, 185.18; 327/536, 537; 330/127, 297
See application file for complete search history.

(56) References Cited

U.S. PATENT DOCUMENTS

| | | | | |
|---|---|---|---|---|
| 7,663,428 | B2 * | 2/2010 | Matano .......................... | 327/536 |
| 8,139,056 | B2 * | 3/2012 | Lee et al. ....................... | 345/211 |
| 8,462,098 | B2 * | 6/2013 | Tobita ............................ | 345/100 |
| 8,493,141 | B2 * | 7/2013 | Khlat et al. ................... | 330/127 |
| 2010/0309716 | A1 | 12/2010 | Tsukada | |

FOREIGN PATENT DOCUMENTS

JP          2010-283992        12/2010

* cited by examiner

*Primary Examiner* — Gene Auduong
(74) *Attorney, Agent, or Firm* — Patterson & Sheridan, LLP

(57) ABSTRACT

A voltage generating circuit includes first and second step-up circuits, each having first and second input terminals and an output terminal and configured to increase a voltage level of an input signal supplied through the first input terminal and output the signal with the increased voltage level through the output terminal. The second input terminal of the first step-up circuit is connected to the output terminal of the second step-up circuit and the second input terminal of the second step-up circuit is connected to the output terminal of the first step-up circuit. The voltage generating circuit may also include third and fourth step-up circuits and fifth and sixth step-up circuits having similar configurations.

20 Claims, 7 Drawing Sheets

NAND TYPE FLASH MEMORY

SCLK=GCLK1, GCLK2, GGCLK1, GGCLK2
X2CLK=GCLK3, GCLK4, GGCLK3, GGCLK4

VOLTAGE GENERATING CIRCUIT AND SEMICONDUCTOR DEVICE INCLUDING THE VOLTAGE GENERATING CIRCUIT

CROSS-REFERENCE TO RELATED APPLICATION

This application is based upon and claims the benefit of priority from Japanese Patent Application No. 2012-122513, filed May 29, 2012, the entire contents of which are incorporated herein by reference.

FIELD

Embodiments described herein relate to a voltage generating circuit and a semiconductor device including the voltage generating circuit.

BACKGROUND

Demand for NAND-type flash memories is rapidly increasing along with an increase in different uses of the NAND-type flash memories for processing large amounts of data, such as images and dynamic images, in mobile appliances. Recently, readout/write of data in NAND-type flash memories at a single power supply voltage or a low-voltage supply voltage has been necessary, and a step-up circuit for supplying a step-up voltage or a negative step-up voltage has been provided for each operation. However, these circuits require a significant area of the memory device.

DETAILED DESCRIPTION

Figure 1:
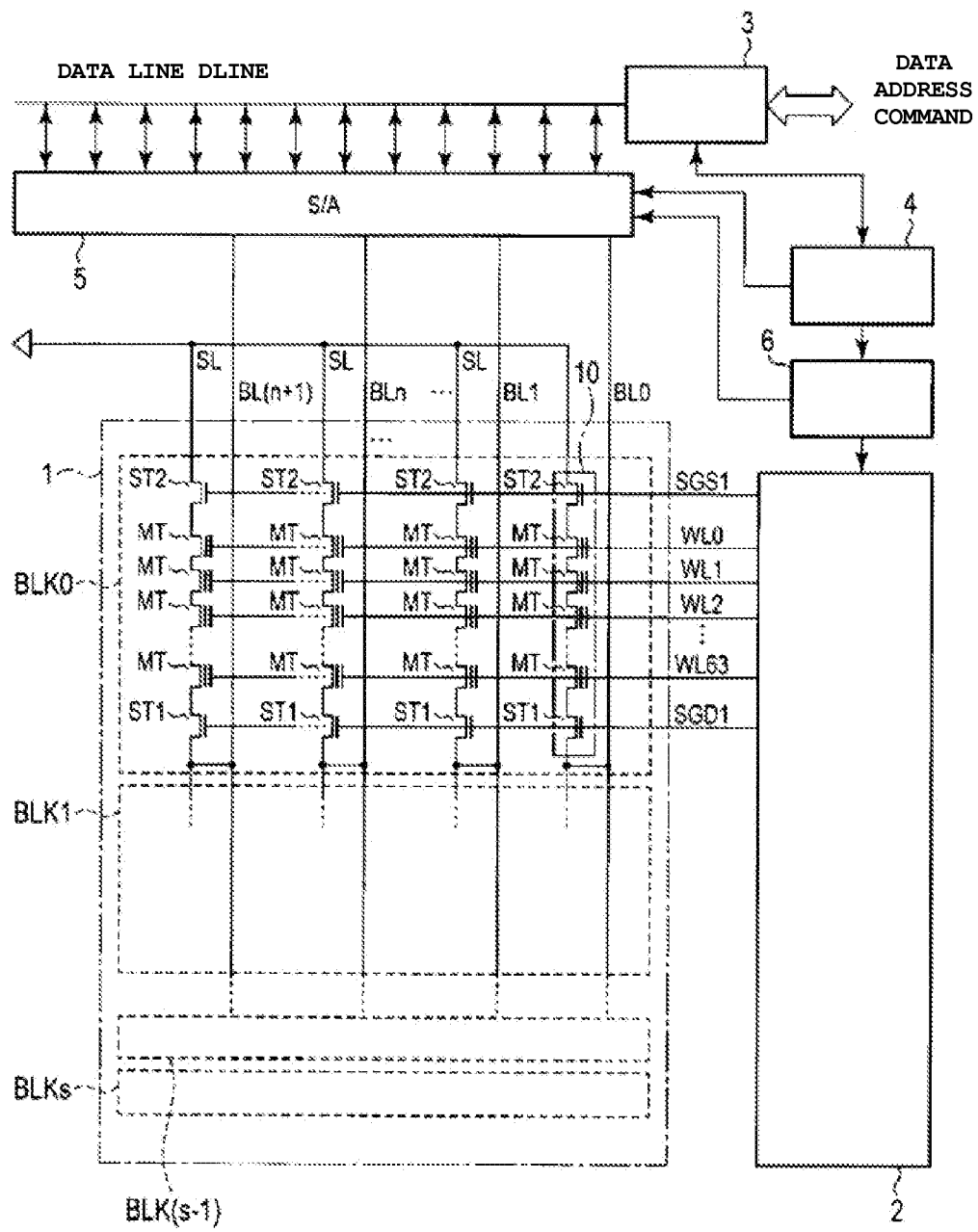
FIG. 1 shows a schematic constitutional example of an NAND-type memory flash according to a first embodiment.

The embodiments provide a voltage generating circuit that can improve voltage transfer efficiency while reducing the circuit area and a semiconductor device including the voltage generating circuit.

In general, the embodiments will be explained with reference to the figures. In the following explanation, reference symbols for specific components are used to refer to the same components for all the figures. However, the figures are schematic, and it should be noted that, in the figures, the relationship between the thickness and the planar size, the ratio of the thickness of each layer, etc., may be different from that of the actual physical device. Therefore, specific thickness and size should be determined with reference to the following explanation. In addition, components with different size relations and ratios are included across the figures.

A voltage generating circuit according to an embodiment includes first and second step-up circuits, each having first and second input terminals and an output terminal and configured to increase a voltage level of an input signal supplied through the first input terminal and output the signal with the increased voltage level through the output terminal. The second input terminal of the first step-up circuit is connected to the output terminal of the second step-up circuit and the second input terminal of the second step-up circuit is connected to the output terminal of the first step-up circuit. The voltage generating circuit may also include third and fourth step-up circuits and fifth and sixth step-up circuits having similar configurations.

A voltage generating circuit according to another embodiment is provided with a first step-up circuit having a first capacitor for stepping up voltage of a first node in response to a first signal; a first transistor that is connected between a first input node and the first node; a second transistor that is connected between the first node and a first output node and whose gate is connected to a second node; a second capacitor for stepping up voltage of the second node in response to a second signal; a third transistor that is connected between the first node and the second node; a second step-up circuit having a third capacitor for stepping up voltage of a third node in response to a third signal complementary to the first signal; a fourth transistor that is connected between a second input node and the third node; a fifth transistor that is connected between the fourth node and the second output node and whose gate is connected to a fourth node; a fourth capacitor for stepping up voltage of the fourth node in response to a fourth signal complementary to the second signal; and a sixth transistor that is connected between the third node and the fourth node. In this voltage generating circuit, a voltage in which the voltage of the second output node has been stepped up is supplied to the gate of the third transistor, and a voltage in which the voltage of the first output node has been stepped up is supplied to the gate of the sixth transistor.

In addition, a semiconductor device according to an embodiment is provided with a memory cell array including several memory cells and a voltage generating circuit for supplying a voltage to the memory cell array. The voltage generating circuit is provided with a first capacitor for stepping up voltage of a first node in response to a first signal; a first transistor that is connected between a first input node and the first node; a second transistor that is connected between the first node and a first output node and whose gate is connected to a second node; a second capacitor for stepping up voltage of the second node in response to a second signal; a third transistor that is connected between the first node and the second node; a third capacitor for stepping up voltage of a third node in response to a third signal complementary to the first signal; a fourth transistor that is connected between a second input node and the third node; a fifth transistor that is connected between the third node and the second output node and whose gate is connected to a fourth node; a fourth capacitor for stepping up voltage of the fourth node in response to a fourth signal complementary to the second signal; and a sixth transistor that is connected between the third node and the fourth node. In this semiconductor device, a voltage in which the voltage of the second output node has been stepped up is supplied to the gate of the third transistor, and a voltage in which the voltage of the first output node has been stepped up is supplied to the gate of the sixth transistor.

First Embodiment

In this embodiment, a pump PUMP of the voltage generating circuit has at least a pair of step-up circuits (a first step-up circuit and a second step-up circuit). A complementary signal is input into the first step-up circuit and the second step-up circuit from a clock driver CLK driver of the voltage generating circuit, and the first step-up circuit and the second step-up circuit complementarily step up the voltage. An output node of the first step-up circuit is supplied to the second step-up circuit, and an output node of the second step-up circuit is supplied to the first step-up circuit, thus being able to improve the voltage transfer performance of the pump.

With reference to FIG. 1, an entire constitutional example of the semiconductor device including the voltage generating circuit of this embodiment will be explained.

1. <Entire Constitutional Example>

As shown in FIG. 1, the semiconductor device of this embodiment is provided with memory cell array 1, a row decoder 2, a data input/output circuit 3, a control module 4, a sense amplifier 5, and a voltage generating circuit 6.

1-1. <Memory Cell Array 1>

The memory cell array 1 includes block BLK0 to BLKs (s represents a natural number). Each block BLK0 to BLKs includes several nonvolatile memory cells MT or memory transistors. Each of the blocks BLK0 to BLKs is provided with several NAND strings 10 in which the nonvolatile memory cells MT are connected in series. Each of the NAND strings 10, for example, includes 64 memory cells MT and selective transistors ST1 and ST2.

The memory cell MT can hold binary or greater data. The structure of the memory cell MT is an FG structure, including a floating gate (charge conduction layer) formed via a gate insulating film on a p-type semiconductor substrate and a control gate formed via an integrated insulating film on the floating gate. Here, the structure of the memory cell MT may also be an MONOS type. The MONOS type is a structure having a charge storage layer (for example, an insulating film) formed via the gate insulating film on the semiconductor substrate, an insulating film (hereinafter, referred to a block layer) that is formed on the charge storage layer and has a dielectric constant higher than that of the charge storage layer, and a control gate formed on the block layer.

The control gate of the memory cell MT is electrically connected to a word line, its drain is electrically connected to a bit line, and its source is electrically connected to a source line. In addition, the memory cell MT is an n channel MOS transistor. Here, the number of memory cells MT is not limited to 64 pieces but may be 128 pieces, 256 pieces, 512 pieces, etc.

Moreover, the adjacent memory cells MT share the source and the drain. A current path is arranged between the selective transistors ST1 and ST2 so that it is connected in series. The drain region at one end of the memory cells MT connected in series is connected to the source region of the selective transistor ST1, and the source region at the other end is connected to the drain region of the selective transistor ST2.

The control gates of the memory cells MT in the same row are commonly connected to any of word lines WL0 to WL63, and the gate electrodes of the selective transistors ST1 and ST2 of the memory cells MT in the same row are commonly connected to selective gate lines SGD1 and SGS1, respectively. Here, to simplify the explanation, in the following, the word lines WL0 to WL63 are sometimes simply called the word lines WL when there is no need to distinguish particular word lines. In addition, the drains of the selective transistors ST1 in the same column in the memory cell array 1 are commonly connected to any of bit lines BL0 to BLn. In the following, the bit lines BL0 to BLn (n: natural number) are also collectively called the bit lines BL when there is no need to distinguish particular bit lines. The sources of the selective transistors ST2 are commonly connected to the source lines SL.

Moreover, data are collectively written into several memory cells MT connected to the same word line WL, and this unit is called a page. In several memory cells MT, data are collectively erased at a block BLK unit.

1-2. <Threshold Distribution of Memory Cells MT>

Figure 2:
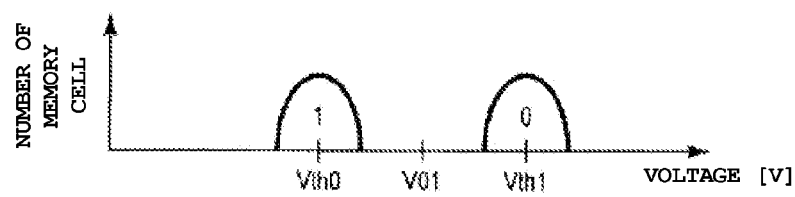
FIG. 2 shows a threshold distribution of memory cells of the first embodiment.

With reference to FIG. 2, a threshold distribution of the memory cells MT will be explained. FIG. 2 is a graph in which the abscissa indicates the threshold distribution (voltage) and the ordinate indicates the number of memory cell MT.

As shown in the figure, each memory cell MT, for example, can hold binary (2-levels) data (1-bit data: two kinds of data of "1" and "0" in order of a low threshold voltage Vth). In addition, the memory cells MT are set to "1" data (for example, negative voltage) in an erasure state, and in writing the data, are set to a positive threshold voltage by providing electric charges into a charge storage layer.

1-3. <Peripheral Circuits>

Peripheral circuits will be explained with reference to FIG. 1.

1-3-1. <Row Decoder 2>

The row decoder 2 decodes a block selecting signal, which is transmitted from the control module 4 at the time of the write operation, the readout operation, and the erasure operation of data, and selects a block BLK based on the result. Next, the row decoder transfers any of the write voltage, the read voltage, and the erasure voltage to each word line WL in the selected block BLK. Specifically, the row decoder 2 transfers a selective write voltage (hereinafter, voltage Vpgm) as the write voltage to the memory cell MT to be written and transfers a nonselective voltage (hereinafter, voltage Vpass) to the other memory cells MT.

In addition, the row decoder 2 transfers a selective read voltage (hereinafter, Vcgr) as the read voltage to a memory cell MT to be read and transfers a nonselective read voltage (hereinafter, voltage Vread) to the other memory cells MT.

Moreover, at the time of the erasure operation, a zero potential is transferred to all the word lines WL of the selected block BLK. Here, at that time, a positive high voltage is applied to the semiconductor substrate (well region) on which the memory cells MT are arranged.

1-3-2. <Data Input/Output Circuit 3>

The data input/output circuit 3 outputs an address and a command supplied from a host via an I/O terminal, not shown in the figure, to the control module 4. In addition, the data input/output circuit 3 outputs write data via a data line $D_{line}$ to the sense amplifier 5. When the data are output to the host, the data input/output circuit receives the data amplified by the sense amplifier 5 via the data line $D_{line}$ based on the control of the control circuit 4 and outputs the data to the host via the I/O terminal.

1-3-3. <Control Module 4>

The control module 4 controls the operation of the entire NAND-type flash memory. In other words, via the data input/output circuit 3, the control module 4 implements an operation sequence in the write operation, the readout operation, and the erasure operation of data based on the address and command transmitted from the host not shown in the figure. The control module 4 generates a block selecting signal/column selecting signal/page selecting signal based on the address and the operation sequence. The control module 4 outputs the block selecting signal to the row decoder 2. In addition, the control module 4 outputs the column selecting signal to the sense amplifier 5. The column selecting signal is a signal for selecting the column direction of the sense amplifier 5.

Moreover, a control signal supplied from a memory controller, not shown in the figure, is transmitted to the control module 4. The control module 4 discriminates whether the signal supplied to the data input/output circuit 3 from the host via the I/O terminal, not shown in the figure, is an address or data by the supplied control signal.

Furthermore, the control module 4 controls a timing of the signal to each transistor constituting the sense amplifier 5.

In addition, the control module 4 supplies an instruction signal for generating a desired clock signal to a clock driver 60 (shown in FIG. 4) constituting the voltage generating circuit 6 when the operation sequence is implemented. The control module 4 controls several step-up sections 61, 62, and 63 (shown in FIG. 4) as well as the clock driver 60. In other words, the control module 4 controls the clock driver 60 and the step-up sections 61, 62, and 63 so that a required voltage (voltage Vpgm, voltage Vpass, voltage Vcgr, voltage Vread, and voltage Vera) is generated in accordance with the operation sequence.

1-3-4. <Sense Amplifier 5>

When data are read, the sense amplifier 5 sends a constant current to the bit lines BL and directly senses the current that is flowed by the memory cells MT after the potential of the bit lines BL is stable. For this reason, the sense amplifier 5 enables a collective readout for all the bit lines BL. In other words, the decision of "1" or "0" of the sense amplifier 5 connected to the bit lines BL is made by the difference of the value of the current that is flowed by the memory cells MT. Here, when data are written, the sense amplifier transfers the write data to the corresponding bit line BL.

1-3-5. <Voltage Generating Circuit 6>

The voltage generating circuit 6 receives an external voltage (hereinafter, voltage Vcc); generates voltage Vpgm, voltage Vpass, voltage Vcgr, voltage Vread, and voltage Vera in accordance with the control module 4; and transfers these voltages to the row decoder 2 etc. In addition, the voltage generating circuit 6 receives the external voltage Vcc and generates voltage VDD, voltage VHSA (=voltage VDD), voltage VX2, voltage VX4, voltage VX2SA, and voltage XXL.

Next, the constitution for generating the voltage VDD, voltage VHSA, voltage VX2, voltage VX4, voltage VX2SA, and voltage XXL will be explained with reference to FIG. 3.

<Constitution of Voltage Generating Circuit 6>

Figure 3:
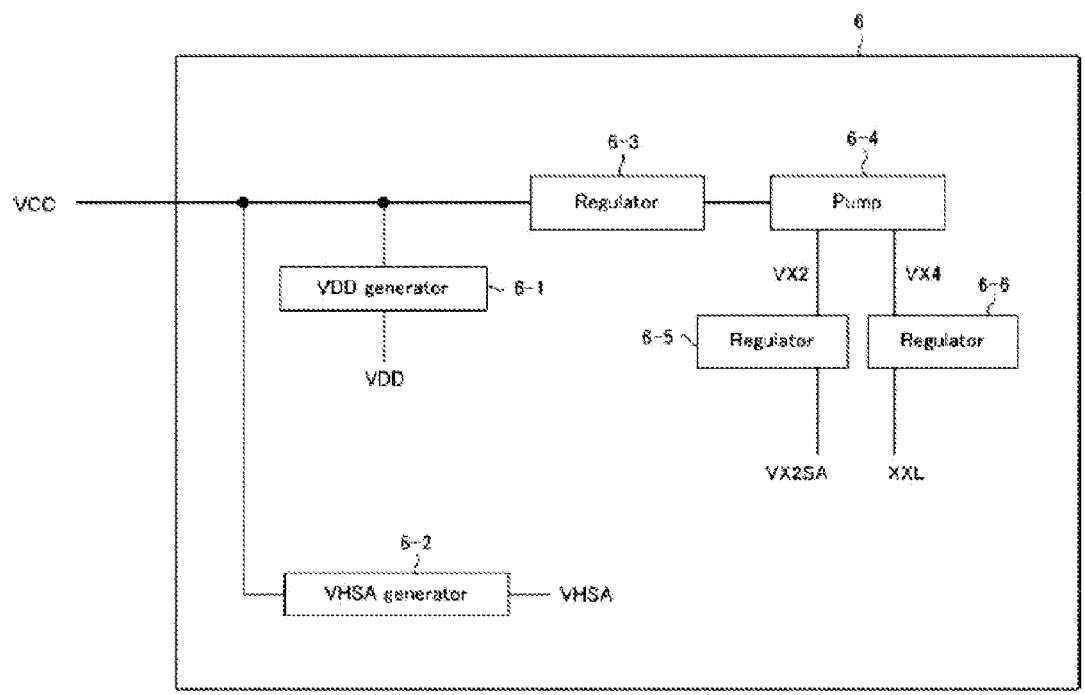
FIG. 3 shows an example of the voltage generating circuit of the first embodiment.

As shown in FIG. 3, the voltage generating circuit 6 generates the voltage VDD, voltage VHSA, voltage VX2, voltage VX4, voltage VX2SA, and voltage XXL. In other words, the voltage generating circuit 6 includes VDD generator 6-1, VHSA generator 6-2, regulator 6-3, pump 6-4, and step-down regulators 6-5 and 6-6.

The VDD generator 6-1 receives the external voltage Vcc and generates the internal voltage VDD based on the external voltage. In addition, the VHSA generator 6-2 receives the external voltage Vcc and generates the voltage VHSA (as previously mentioned, the same value as the voltage VDD) based on the external voltage.

The regulator 6-3 receives the voltage Vcc and outputs its stepped-up voltage or stepped-down voltage to the pump 6-4 according to a desired protocol. The pump 6-4 steps up the voltage output from the regulator 6-3 to a voltage VX2 (>VDD) and a voltage VX4 (>VX2). A detailed constitution of the pump 6-4 will be described later.

The step-down regulator 6-5 receives the voltage VX2 from the pump 6-4 and generates the voltage VX2SA (voltage VDD<voltage VX2SA<voltage VX2). Similarly, the step-down regulator 6-6 receives the voltage VX4 from the pump 6-4 and generates the voltage XXL (voltage VX2<voltage XXL<voltage VX4). A detailed constitution of the step-down regulators 6-5 and 6-6 will be described later.

Here, the pump 6-4 may also generate the voltage VX2 and the voltage VX4 based on the voltage VDD generated from the VDD generator 6-1.

<Constitutional Example of Pump 6-4>

Next, a constitutional example of the pump 6-4 of this embodiment will be explained with reference to a block diagram of FIG. 4 and circuit diagrams of FIG. 5 and FIG. 6.

The pump 6-4 includes the clock driver 60 and several step-up sections 61-63. The clock driver 60 and the several step-up sections 61-63 will be explained.

Based on an instruction signal supplied from the control module 4 (FIG. 1), the clock driver 60 has a function of generating a desired clock signal corresponding to the instruction signal from a reference clock signal PMPCLK.

Here, the reference clock signal PMPCLK is a clock signal generated in the semiconductor device.

The clock driver 60 receives the supply of the reference clock signal PMPCLK and generates clock signals GGCLK1 and GGCLK2, clock signals GCLK1 and GCLK2, and clock signals VCLK1 and VCLK2. Here, the clock signals GGCLK2, GCLK2, and VCLK2 are respectively signals in which the clock signals GGCLK1, GCLK1, and VCLK1 are shifted by a half period (180°). An output node of the clock driver 60 is connected to the step-up section (step-up circuits 61-1 to 61-6) and the step-up sections 62 and 63.

The clock driver 60 has a delay circuit 60-1, an arithmetic operation module 60-2, and a register 60-3.

The delay circuit 60-1, for example, is composed of several inverters. The reference clock PMPCLK is supplied to the delay circuit 60-1, and the delay circuit 60-1 has a function of shifting the phase by delaying the reference clock signal PMPCLK. The delay circuit 60-1 generates a signal in which the reference clock signal PMPCLK, for example, is shifted by a half period. The delay circuit 60-1 generates several signals in which the edges of clocks are shifted.

The arithmetic operation module 60-2 applies a desired algorithm to several signals generated by the reference clock signal PMPCLK or delay circuit 60-1 to generate the clock signals GGCLK1 and GGCLK2, clock signals GCLK1 and GCLK2, and clock signals VCLK1 and VCLK2.

The register 60-3 has a table in which instruction signals, which are supplied from the control module 4, and operation sequences of the arithmetic operation module 60-2 are made to correspond to each other. Based on the table of the register 60-3, the clock driver 60 controls the arithmetic operation module 60-2 so that an arithmetic operation corresponding to the instruction signal is supplied from the control module.

Next, the step-up section 61 (step-up circuits 61-1 to 61-6) of this embodiment will be explained with reference to the block diagram of FIG. 4 and the circuit diagram of FIG. 5.

Figure 4:
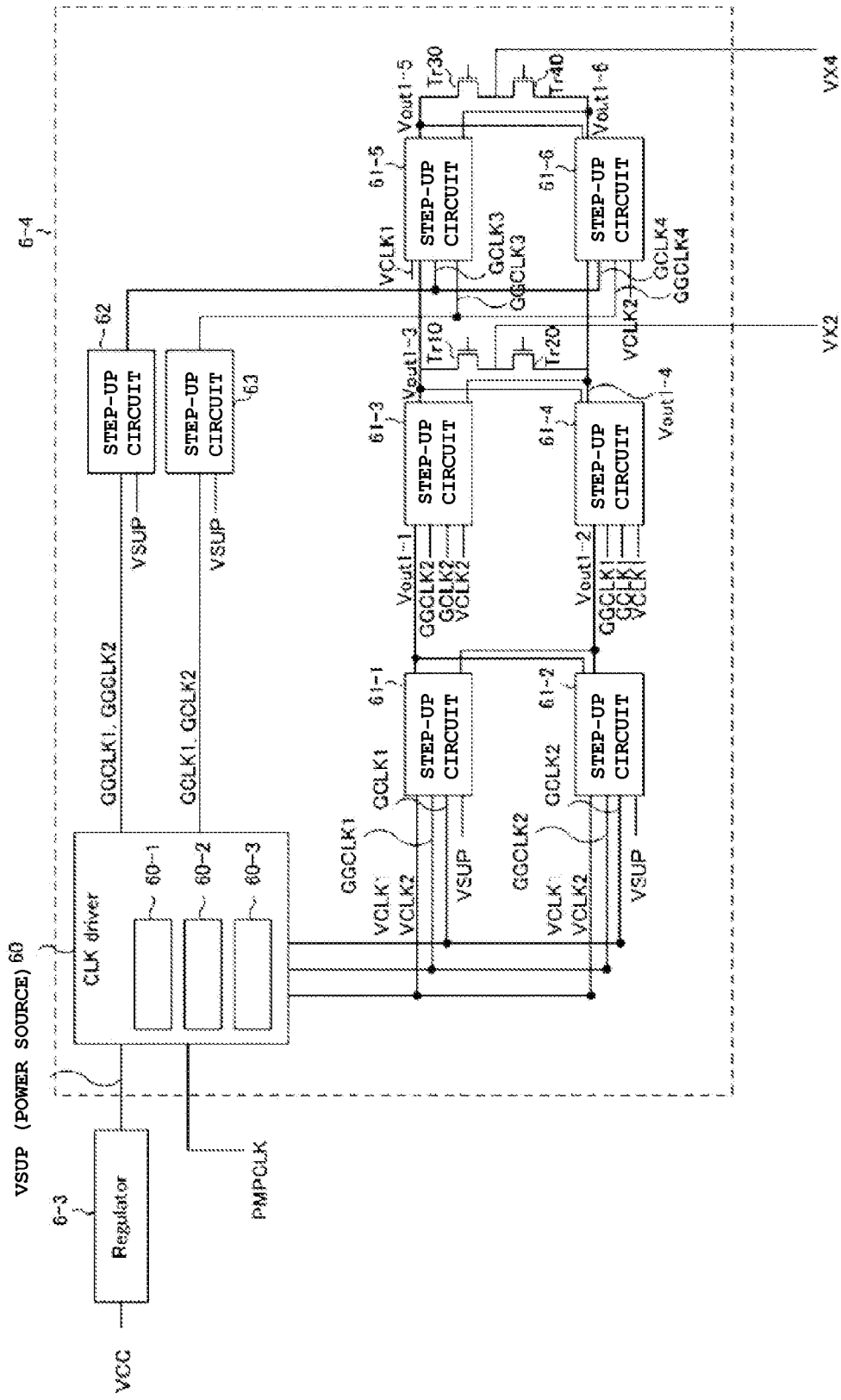
FIG. 4 shows an example of a regulator and a pump of the first embodiment.

As shown in FIG. 4, the step-up section 61 includes six step-up circuits 61-1 to 61-6. The number of step-up circuits is not limited to six circuits but may also be 8 circuits, 10 circuits, etc., for instance. In terms of the relation shown in the figures, the case of six step-up circuits has been shown in FIG. 4 and FIG. 5.

The clock signals VCLK1, VCLK2, GCLK1, and GGCLK1 are supplied to the step-up circuit 61-1 from the clock driver 60. Similarly, the clock signals VCLK1, VCLK2, GCLK2, and GGCLK2 are supplied to the step-up circuit 61-2 from the clock driver 60.

An output node of the step-up circuit 61-1 is supplied to the step-up circuit 61-2. In addition, an output node of the step-up circuit 61-2 is supplied to the step-up circuit 61-1. The connection relation will be explained in detail in FIG. 5.

The clock signals VCLK2, GCLK2, and GGCLK2 are supplied to the step-up circuit 61-3 from the clock driver 60. The clock signals VCLK1, GCLK1, and GGCLK1 are supplied to the step-up circuit 61-4 from the clock driver 60.

An output node of the step-up circuit 61-3 is supplied to the step-up circuit 61-4. In addition, an output node of the step-up circuit 61-4 is supplied to the step-up circuit 61-3. The connection will be explained in detail in FIG. 5.

The clock signals VCLK1, GCLK3, and GGCLK3 are supplied to the step-up circuit 61-5 from the clock driver 60. The clock signals VCLK2, GCLK4, and GGCLK4 are supplied to the step-up circuit 61-6 from the clock driver 60.

An output node of the step-up circuit 61-6 is supplied to the step-up circuit 61-5. In addition, an output node of the step-up circuit 61-5 is supplied to the step-up circuit 61-6. The connection will be explained in detail in FIG. 5.

The output nodes of the step-up circuits 61-3 and 61-4 are connected via several MOS transistors Tr10 to Tr40 to the step-down regulators 6-5 and 6-5 (shown in FIG. 3). More specifically, the output node (Vout1-3) of the step-down circuit 61-3 is connected to one end of a current path of the MOS transistor Tr10. The output node (Vout1-4) of the step-up circuit 61-4 is connected to one end of a current path of the MOS transistor Tr20. The step-down regulator 6-5 is commonly connected to the other end of the current path of the transistor Tr10 and the other end of the current path of the transistor Tr20. The voltage VX2 can be transferred to the step-down regulator 6-5 by applying a voltage at high "H" level to the gates of the transistors Tr10 and Tr20.

In addition, the output node (Vout1-5) of the step-up circuit 61-5 is connected to one end of the current path of the MOS transistor Tr30. The output node (Vout1-6) of the step-up circuit 61-6 is connected to one end of the current path of the MOS transistor Tr40. The step-down regulator 6-6 is commonly connected to the other end of the current path of the transistor Tr30 and the other end of the current path of the transistor Tr40. The voltage VX4 can be transferred to the step-down regulator 6-6 by applying a voltage at "H" level to the gates of the transistors Tr30 and Tr40.

Here, the MOS transistors Tr10 to Tr40 are N channel-type MOS transistors.

A detailed constitutional example of the step-up circuits 61-1 to 61-6 will be explained with reference to FIG. 5. The step-up circuits 61-1 and 61-2 have the same constitution. The step-up circuits 61-3 and 61-4 have the same constitution. Here, in FIG. 5, for convenience of illustration, the MOS transistors Tr10 to Tr40 (shown in FIG. 4) have been omitted.

The step-up circuit 61-1 has four MOS transistors Tr1-1 to Tr1-4 and capacitor elements Cap1-1 to Cap1-3. The transistors Tr1-1 to Tr1-4 are N channel-type MOS transistors.

One end of a current path of the transistor Tr1-4 is connected to the regulator 6-3 (VSUP) (shown in FIG. 4), the other end is connected to a node N1, and the clock signal VCLK2 is supplied to its gate. One end of the capacitor element Cap1-1 is connected to the node N1, and the clock signal VCLK1 is supplied to the other end. One end of a current path of the transistor Tr1-1 is connected to the node N1, the other is connected to the output node (Vout1-1) of the step-up circuit 61-1, and its gate is connected to a node N2. One end of a current path of the transistor Tr1-2 is connected to the node N1, the other is connected to the node N2, and its gate is connected to a node N3.

One end of the capacitor element Cap1-2 is connected to the node N2, and the clock signal GCLK1 is supplied to the other end.

One end of the capacitor element Cap1-3 is connected to a node N3, and the clock signal GGCLK1 is supplied to the other end. One end of a current path of the transistor Tr1-3 is connected to a node N3, the other end is connected to the output node of the step-up circuit 61-2, and its gate is connected to a node N6 of the step-up circuit 61-2.

Similarly, the step-up circuit 61-2 has four pieces of MOS transistors Tr2-1 to Tr2-4 and capacitor elements Cap2-1 to Cap2-3. The transistors Tr2-1 to Tr2-4 are N channel-type MOS transistors.

One end of a current path of the transistor Tr2-4 is connected to the regulator 6-3 (VSUP), the other end is connected to a node N4, and the clock VCLK1 is supplied to its gate. One end of the capacitor element Cap2-1 is connected to the node N4, and the clock signal VCLK2 is supplied to the other end. One end of a current path of the transistor Tr2-1 is connected to the node N4, the other is connected to the output node (Vout1-2) of the step-up circuit 61-2, and its gate is connected to a node N5. One end of a current path of the transistor Tr2-2 is connected to the node N4, the other is connected to the node N5, and its gate is connected to the node N6. One end of the capacitor element Cap2-2 is connected to the node N5, and the clock signal GCLK2 is supplied to the other end.

One end of the capacitor element Cap2-3 is connected to the node N6, and the clock signal GGCLK2 is supplied to the other end. One end of a current path of the transistor Tr2-3 is connected to the node N6, the other end is connected to a first output node of the step-up circuit 61-1, and its gate is connected to the node N3 of the step-up circuit 61-1.

Next, the constitution of the step-up circuits 61-3 and 61-4 will be explained. As shown in FIG. 5, the step-up circuits 61-3 and 61-5 have the same constitution as the constitution of the step-up circuit 61-1 with the exception of the transistor Tr1-4 being excluded. The step-up circuits 61-4 and 61-6 have the same constitution as the constitution of the step-up circuit 61-2 with the exception of the transistor Tr2-4 being excluded. In the step-up circuit 61-1, the clock signal VCLK1 is supplied to the other end of the capacitor element Cap1-1, the clock signal GCLK1 is supplied to the other end of the capacitor element Cap1-2, and the clock signal GGCLK1 is supplied to the other end of the capacitor element Cap1-3. In the step-up circuit 61-3, the clock signal VCLK2 is supplied to the other end of the capacitor element Cap3-1, the clock signal GCLK2 is supplied to the other end of the capacitor element Cap3-2, and the clock signal GGCLK2 is supplied to the other end of the capacitor element Cap3-3.

In addition, in the step-up circuit 61-5, the clock signal VCLK1 is supplied to the other end of the capacitor element Cap5-1, the clock signal GCLK3 is supplied to the other end of the capacitor element Cap5-2, and the clock signal GGCLK3 is supplied to the other end of the capacitor element Cap5-3.

Similarly, in the step-up circuit 61-2, the clock signal VCLK2 is supplied to the other end of the capacitor element Cap2-1, the clock signal GCLK2 is supplied to the other end of the capacitor element Cap2-2, and the clock signal GGCLK2 is supplied to the other end of the capacitor element Cap2-3. In the step-up circuit 61-4, the clock signal VCLK1 is supplied to the other end of the capacitor element Cap4-1, the clock signal GCLK1 is supplied to the other end of the capacitor element Cap4-2, and the clock signal GGCLK1 is supplied to the other end of the capacitor element Cap4-3.

Moreover, in the step-up circuit 61-6, the clock signal VCLK2 is supplied to the other end of the capacitor element Cap6-1, the clock signal GCLK4 is supplied to the other end of the capacitor element Cap6-2, and the clock signal GGCLK4 is supplied to the other end of the capacitor element Cap6-3.

Here, the clocks GGCLK3, GGCLK4, GCLK3, and GCLK4 are clock signals that are generated by the step-up sections 62 and 63 (both shown in FIG. 4).

The difference between the clock signal GGCLK3 and the clock signal GGCLK1 is that the clock signal GGCLK3 is a pulse with more high amplitude than the clock signal GGCLK1 and the pulses have the same phase. The difference between the clock signal GGCLK4 and the clock signal GGCLK12 is that the clock signal GGCLK4 is a pulse with more high amplitude than the clock signal GGCLK2 and the pulses have the same phase.

The difference between the clock signal GCLK3 and the clock signal GCLK1 is that the clock signal GCLK3 is a pulse with high amplitude and the pulse has the same phase. The difference between the clock signal GCLK4 and the clock signal GCLK2 is that the clock signal GCLK4 is a pulse with high amplitude and the pulse has the same phase.

Each of the step-up circuits 61-1 to 61-6 of the step-up section 61 steps up the voltage supplied from the input node based on the clock signal VCLK1 or VCLK2 that is input from the other end of the capacitor elements Cap1-1 to Cap6-1.

Next, the step-up sections 62 and 63 of this embodiment will be explained with reference to the circuit diagrams of FIG. 4 to FIG. 6.

The step-up section 62 receives the clock signals GGCLK1 and GGCLK2 from the clock driver 60. The step-up section 62 increases the amplitude of the clock signals GGCLK1 and GGCLK2 and supplies the clock signals GGCLK3 and GGCLK4 to the step-up circuits 61-5 and 61-6. The clock signal GGCLK3 is a pulse in which the clock signal GGCLK1 has been amplified, and the clock signal GGCLK4 is a pulse in which the clock signal GGCLK2 has been amplified.

Similarly, the step-up section 63 receives the clock signals GCLK1 and GCLK2 from the clock driver 60. The step-up section 62 increases the amplitude of the clock signals GCLK1 and GCLK2 and supplies the clock signals GCLK3 and GCLK4 to the step-up circuits 61-5 and 61-6. The clock signal GCLK3 is a pulse in which the clock signal GCLK1 has been amplified, and the clock signal GCLK4 is a pulse in which the clock signal GCLK2 has been amplified.

A detailed circuit constitution example of the step-up sections 62 and 63 will be explained with reference to FIG. 6. The step-up sections 62 and 63 have the same constitution. For convenience of illustration, a clock signal, which is supplied to the step-up sections 62 and 63, is generally called SCLK; an inputting power source is generally called VSUP; and an outputting clock is generally called a clock signal X2CLK. The signal SCLK shown in the figure in the step-up section 62 corresponds to the clock signals GGCLK1 and GGCLK2, and the signal X2CLK shown in the figure corresponds to the clock signals GCLK3 and GGCLK4.

The step-up sections 62 and 63, for example, have five MOS transistors Tr7-1 to Tr7-5 and a capacitor element Cap7-1. Here, the transistors Tr7-1 and Tr7-3 are N channel-type MOS transistors, and the transistors Tr7-2, Tr7-5, and Tr7-6 are P channel-type MOS transistors.

One end of a current path of the transistor Tr7-1 is connected to a ground potential VSS, and the other end is connected to a node N19. The voltage VSUP is supplied to one end of a current path of the transistor Tr7-2, and the other end is connected to the node N19. The gates of the transistors Tr7-1 and Tr7-2 are connected to the clock driver 60 (shown in FIG. 5), and the clock signal SCLK is supplied to them.

One end of the capacitor Cap7-1 is connected to a node N20, and the other end is connected to a node N19. One end of a current path of the transistor Tr7-3 is connected to the ground potential VSS, the other end is connected to the step-up circuits 61-5 and 61-6 (shown in FIG. 5) and supplies the clock signal X2CLK.

Figure 5:
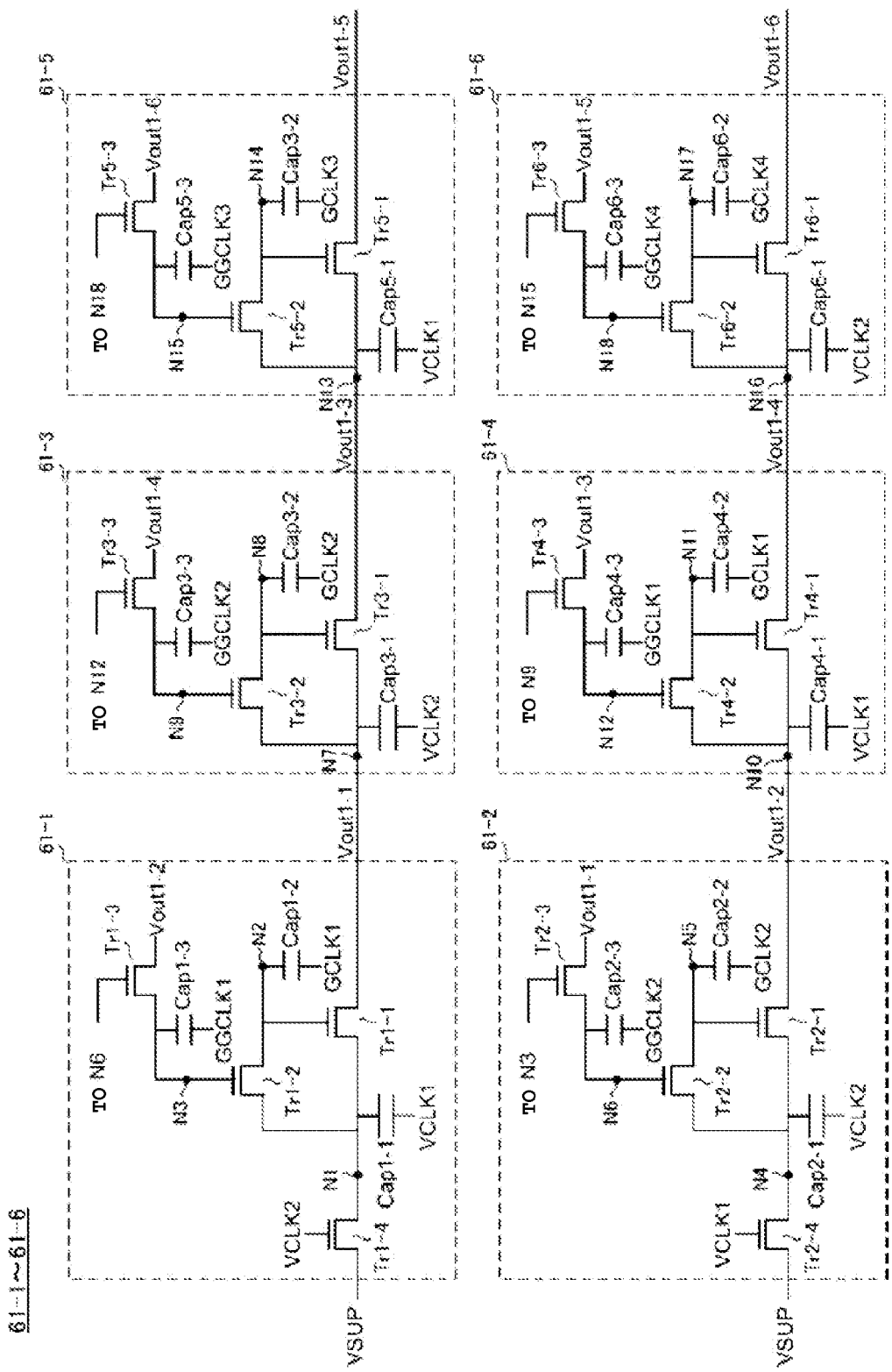
FIG. 5 shows an example of a step-up circuit of the first embodiment.
Figure 6:
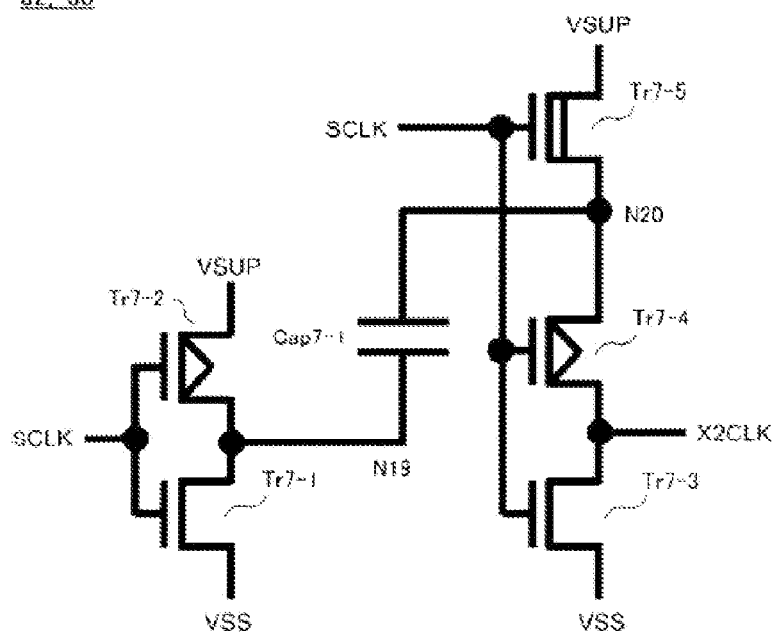
FIG. 6 shows an example of other step-up circuits of the first embodiment.

One end of a current path of the transistor Tr7-4 is connected to the node N20, and the other end is connected to the step-up circuits 61-5 and 61-6 (shown in FIG. 5). The voltage VSUP is supplied to one end of a current path of the transistor Tr7-5, and the other end is connected to the node N20.

The gates of the transistors Tr7-3 to Tr7-5 are commonly connected to the clock driver 60 (shown in FIG. 5), and the clock signal SCLK is supplied to them.

When the clock signal SCLK, which is supplied to the step-up sections 62 and 63, is at "H" level, the voltage VSUP is transferred to the node N20, and electric charges are accumulated in the capacitor Cap1-1. Next, when the clock signal SCLK is at low "L" level, the transistor Tr7-2 is turned on, and the transistor Tr7-1 is turned off, so that the electric charges accumulated in the capacitor element CaP7-1 are increased, thereby stepping up the voltage. At that time, the transistor Tr7-4 is turned on, and the stepped-up voltage is supplied as the clock signal X2CLK to the step-up circuits 61-5 and 61-6 (shown in FIG. 5).

<Constitutional Example of Step-Down Regulator 6-5>

Figure 7:
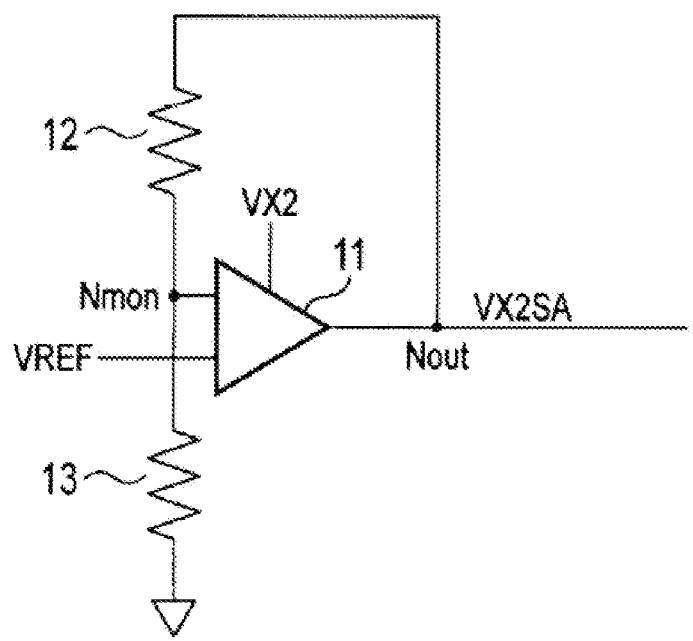
FIG. 7 shows an example of a step-down regulator of the first embodiment.

A constitutional example of the step-down regulator 6-5 will be explained with reference to FIG. 7. As shown in FIG. 7, the step-down regulator 6-5 is provided with a comparator 11 and resistors 12 and 13. The comparator 11 receives the voltage VX2 output from the pump circuit 6-4 and controls the output voltage so that the voltage VREF and the potential of a node Nmon are matched. At that time, the comparator 11 outputs the voltage VX2SA to a node Nout. In addition, one end of the resistor 12 is connected to the node Nout, and the other end is connected to the node Nmon. One end of the resistor 13 is connected to the node Nmon, and the other end is grounded.

2. <Step-Up Operation>

Figure 8:
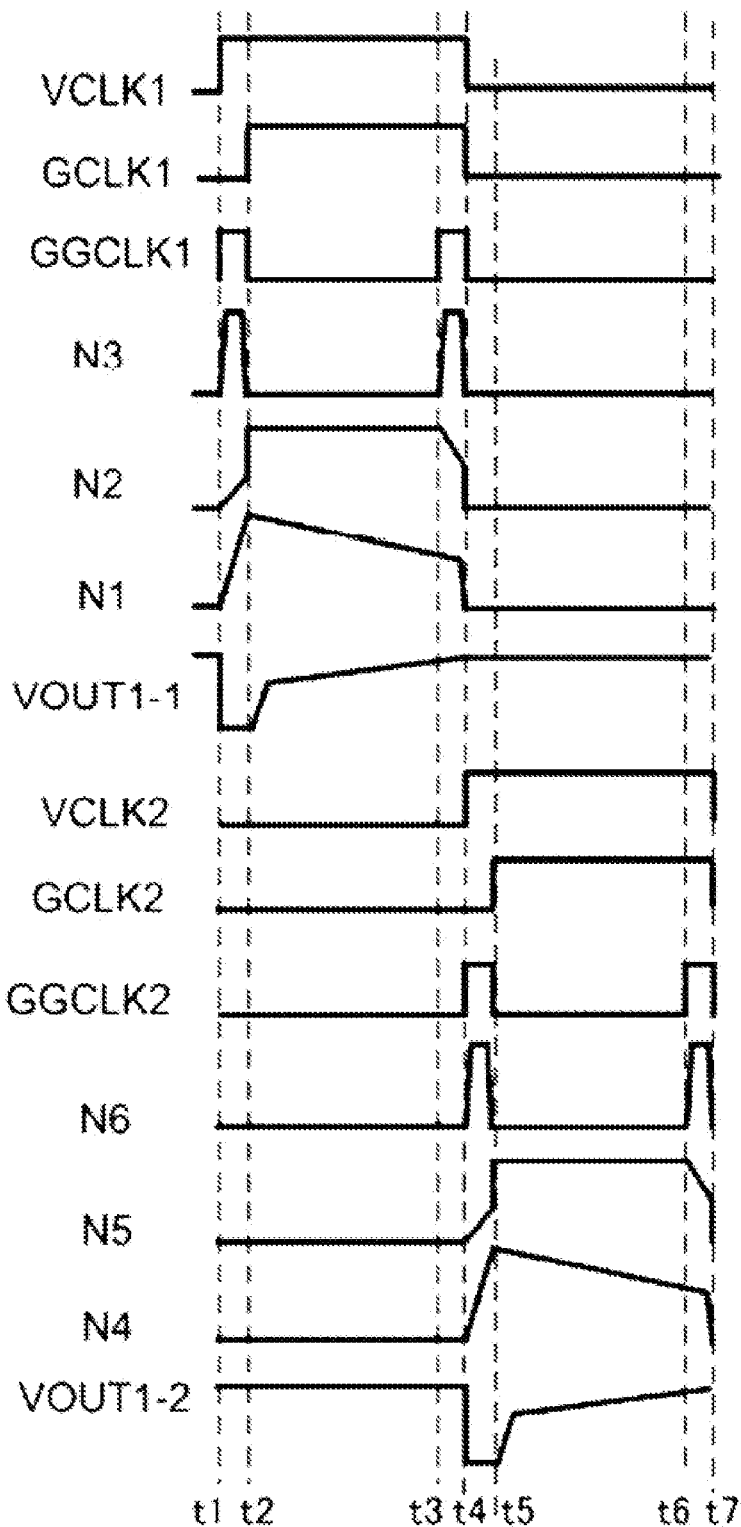
FIG. 8 is a timing chart showing the operation of the pump of the first embodiment.

Next, the step-up operation of the pump 6-4 of this embodiment will be explained with reference to a timing chart in FIG. 8. For convenience of illustration of the pump 6-4, clock signals and output signals of the step-up circuits 61-1 and 61-2 (shown in FIG. 5) are illustrated. In addition, FIG. 8 is a timing chart showing the case in which the step-up operation of the pump 6-4 is stable. In other words, in the following explanation, it is assumed that the voltage VSUP is supplied to the first and second input nodes of each of the step-up circuits 61-1 and 61-2 and that the voltage 2VSUP (=VSUP times 2) is output from the first and second output nodes of each of the step-up circuits 61-1 and 61-2.

2.1<Time t1>

First, at time t1, the clock signal VCLK1 is at high "H" level; the clock signal GCLK1 is at low "L" level; the clock signal GGCLK1 is at "H" level; the clock signal VCLK2 is at "L" level; the clock signal GCLK2 is at "L" level; and the clock signal GGCLK2 is at "L" level.

In the step-up circuit 61-1, the transistor Tr1-4 (shown in FIG. 5) is turned off, and the voltage supplied to the step-up circuit 61-1 is not transferred, but is cut off. Before the time t1, the voltage (VSUP-Vth1-4) has already been transferred to the node N1; at the time t1, the voltage of the node N1 is stepped up to the voltage (VSUP-Vth1-4)+VCLK1 along with the clock signal VCLK1.

Next, for convenience of the explanation, the threshold voltage of a transistor Trx is indicated by Vthx. The "x" in transistor Trx is a suffix corresponding to a transistor shown in FIGS. 4-6 and the "x" in Vthx is a suffix corresponding to the threshold voltage of the transistor Trx. For example, "Vth1-4" corresponds to a threshold voltage of transistor Tr1-4. In addition, for convenience of the explanation, the voltage value of the clock signal VCLK1 is indicated by VCLK1. For the other clock signals, the voltage values are indicated by the names of the clock signals.

Before the time t1, the voltage (2VSUP Vth1-3 (2VSUP subtracted from Vth1-3)) has already been transferred to the node N3; at the time t1, the voltage of the node N3 of the step-up circuit 61-1 is stepped up to the voltage (2VSUP-Vth1-3)+GGCLK1 as the clock signal GGCLK1 turns to "H" level.

Before the time t1, the voltage (VSUP-Vth1-4) has already been transferred to the node N1; at the time t1, the voltage of the node N3 is stepped up, so that the transistor Tr1-2 is slowly turned on, thereby transferring the voltage (VSUP-Vth1-4) to the node N2.

The voltage (2VSUP-Vth1-3)+GGCLK1 is greater than the voltage (VSUP-Vth1-4)+Vth1-2, and after the voltage drop of the threshold voltage of the transistor Tr1-2 is lowered, the voltage can be transferred.

In the step-up circuit 61-2, the transistor Tr2-4 is turned on, and the voltage (VSUP-Vth2-4) is transferred to the node N4. Since the node N3 of the step-up circuit 61-1 is stepped up and the transistor Tr2-3 is turned on, the voltage (2VSUP-Vth2-3) is transferred to the node N6.

2.2<Time t2>

Next, at time t2, while the clock signal VCLK1 maintains "H" level, the clock signal GCLK1 turns to "H" level, and the clock signal GGCLK1 turns to "L" level. Still, the clock signal VCLK2 is at "L" level, the clock signal GCLK2 is at "L" level, and the clock signal GGCLK2 is at "L" level.

In the step-up circuit 61-1, after the transfer of the voltage (VSUP-Vth1-4) to the node N2 at the time t1, the voltage of the node N2 is stepped up to the voltage (VSUP-Vth1-4)+GCLK1 along with the clock signal GCLK1.

As a result, the voltage (VSUP-Vth1-4)+GCLK1 is applied to the gate of the transistor Tr1-1 so that the transistor Tr1-1 is turned on, thereby transferring the voltage (VSUP-Vth1-4)+VCLK1 to the first output node.

The voltage (VSUP-Vth1-4)+GCLK1 is greater than the voltage (VSUP-Vth1-4)+Vth1-1, and after the voltage drop of the threshold voltage of the transistor Tr1-1 is lowered, the voltage can be transferred.

In the step-up circuit 16-2, the voltage of the node N3 turns to "L" level, so that the transistor Tr2-3 is cut off, thereby stopping the charge of the node N6.

In the voltage of the node N3 of the step-up circuit 16-1, the clock signal GGCLK1 turns to "L" level, so that the voltage of the node N3 becomes (2VSUP-Vth1-3).

2.3<Time t3>

Next, at time t3, while the clock signal VCLK1 maintains "H" level and the clocks signal GCLK1 maintains "H" level, the clock signal GGCLK1 turns to "H" level. Still, the clock signal VCLK2 is at "L" level, the clock signal GCLK2 is at "L" level, and the clock signal GGCLK2 is at "L" level.

Since the clock signal GGCLK1 turns to "H" level, the voltage (2VSUP-Vth1-3) of the node N3 transferred at the time t2 is stepped up to the voltage (2VSUP-Vth1-3)+GGCLK1.

Since the voltage of the node N3 is stepped up, the transistor Tr2-3 is turned on, and the voltage (2VSUP-Vth2-3) is transferred from the first output node.

2.4<Time t4>

Next, at time t4, the clock signal VCLK1 turns to "L" level, the clock signal GCLK1 turns to "L" level, and the clock signal GGCLK1 turns to "L" level. Still, the clock signal VCLK2 is at "L" level, the clock signal GCLK2 is at "L" level, and the clock signal GGCLK2 is at "L" level.

Since the clock signal GGCLK1 turns to "L" level, the voltage of the node N3 becomes the voltage (2VSUP-Vth1-3).

The voltage of the node N2 is lowered to the voltage (VSUP-Vth1-4).

Therefore, in the step-up circuit 61-1, the voltage (VSUP-Vth1-4)+VCLK1 is transferred from the first output node, and this voltage is supplied to the step-up circuit 61-3.

On the other hand, in the step-up circuit 61-2, a desired voltage is charged in the nodes N4 and N6.

2.5<From Time t5>

The operation generated in the step-up circuit 61-1 at the time t1-t4 is generated in the step-up circuit 61-2 at time t4-t7, and the operation generated in the step-up circuit 61-2 at the time t1-t4 is generated in the step-up circuit 61-1 at the time t4-t7. Through the repetition in an alternate fashion, electric charges are transferred, stepping up the output.

Effects of this Embodiment

According to the semiconductor device of this embodiment, the following effects (1) and (2) can be obtained.

(1) The voltage transfer efficiency in the pump 6-4 can be improved.

In a conventional semiconductor device, the voltage VSUP is supplied to the other end of the current path of a transistor Tr1-3 which would be included in a step-up circuit configured similarly to the step-up circuit 61-1. In the case of the conventional device, the voltage transferable to the node N3 is the voltage (VSUP-Vth1-3).

However, according to embodiments described herein, one end of the current path of the transistor Tr1-3 in FIG. 5 is connected to the node N3, the other end is connected to the output node of the step-up circuit 61-2, and its gate is connected to the node N6 of the step-up circuit 61-2. In this case, the voltage transferable to the node N3 is the voltage (2VSUP-Vth1-3).

In recent low-voltage system NAND-type flash memories, if the step-up circuits are designed like the conventional example, when the voltage of the node N1 is transferred, a voltage drop in the threshold voltage of the transistor Tr1-2 occurs, lowering the transfer efficiency.

Although the voltage of the node N2 is raised by the capacitor element Cap1-2, the influence of the voltage drop of the threshold voltage of the transistor Tr1-2 is large, so that the voltage drop of the threshold voltage of the transistor Tr1-1 occurs, thereby making it unable to transfer the voltage of the node N1 efficiently.

However, according to embodiments described herein, since the voltage that is transferred to the node N3 is twice that of the conventional example, when the voltage of the node N1 is transferred, the voltage drop of the threshold voltage of the transistor Tr1-2 and, furthermore, the voltage drop of the threshold voltage of the transistor Tr1-1 can be lowered, as compared with the conventional example. Therefore, the semiconductor device according to embodiments described herein, improve the charge transfer efficiency, as compared with the conventional example.

(2) The circuit area in the pump 6-4 can be reduced.

According to embodiments described herein, the first output node of the step-up circuit 61-1 (FIG. 5) is electrically connected to the third input node of the step-up circuit 61-3, and the third output node of the step-up circuit 61-3 is electrically connected to the fifth input node of the step-up circuit 61-5. Similarly, the second output node of the step-up circuit 61-2 is electrically connected to the fourth input node of the step-up circuit 61-4, and the fourth output node of the step-up circuit 61-4 is electrically connected to the sixth input node of the step-up circuit 61-6.

Therefore, the transistor Tr1-4 of the step-up circuit 61-1 is not required to be separately disposed in the step-up circuits 61-3 and 61-5, and the transistor Tr2-4 of the step-up circuit 61-2 is not required to be separately disposed in the step-up circuits 61-4 and 61-6. As compared with a conventional example where the transistors are separately disposed in a step-up circuit, the circuit area of the pump 6-4 can be reduced.

In addition, in a conventional step-up circuit, a capacitor element Cap1-3 and a transistor Tr1-3 would be omitted from the step-up circuit 61-1. In this conventional example, it is necessary to install a separate step-up circuit within each step-up circuit to generate the voltage that is supplied to the gate of the transistor Tr1-2.

However, according to embodiments described herein, although the separate step-up sections 62 and 63 are utilized for the step-up circuits 61-5 and 61-6, no separate step-up circuit is provided in the step-up circuits 61-1 to 61-4. Therefore, according to this embodiment, the circuit area of the pump 6-4 can be reduced, as compared with the conventional example.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A voltage generating circuit, comprising:
a voltage generator configured to receive an external voltage and to generate a first voltage; and
a pump circuit configured to receive a second voltage and to generate a third voltage that is higher than the first voltage and a fourth voltage that is higher than the first voltage,
the pump circuit including at least a first step-up circuit and a second step-up circuit, each having first and second input terminals and an output terminal and configured to increase a voltage level of an input signal supplied through the first input terminal and output the signal with the increased voltage level through the output terminal, wherein the second input terminal of the first step-up circuit is connected to the output terminal of the second step-up circuit and the second input terminal of the second step-up circuit is connected to the output terminal of the first step-up circuit.

2. The voltage generating circuit of claim 1, wherein the voltage level of the input signal supplied through the first input terminal of the first step-up circuit is equal to the voltage level of the input signal supplied through the first input terminal of the second step-up circuit.

3. The voltage generating circuit of claim 1, wherein the pump circuit further comprises:
third and fourth step-up circuits, each having first and second input terminals and an output terminal and configured to increase a voltage level of an input signal supplied through the first input terminal and output the signal with the increased voltage level through the output terminal, wherein
the first input terminal of the third step-up circuit is connected to the output terminal of the first step-up circuit and the first input terminal of the fourth step-up circuit is connected to the output terminal of the second step-up circuit, and
the second input terminal of the third step-up circuit is connected to the output terminal of the fourth step-up circuit and the second input terminal of the fourth step-up circuit is connected to the output terminal of the third step-up circuit.

4. The voltage generating circuit of claim 3, wherein the pump circuit further comprises:
fifth and sixth step-up circuits, each having first and second input terminals and an output terminal and configured to increase a voltage level of an input signal supplied through the first input terminal and output the signal with the increased voltage level through the output terminal, wherein
the first input terminal of the fifth step-up circuit is connected to the output terminal of the third step-up circuit and the first input terminal of the sixth step-up circuit is connected to the output terminal of the fourth step-up circuit, and
the second input terminal of the fifth step-up circuit is connected to the output terminal of the sixth step-up circuit and the second input terminal of the sixth step-up circuit is connected to the output terminal of the fifth step-up circuit.

5. The voltage generating circuit of claim 4, further comprising:
a first step down regulator connected to the output terminals of the third and fourth step-up circuits and configured to supply a fifth voltage that is lower than the third voltage; and
a second step down regulator connected to the output terminals of the fifth and sixth step-up circuits and configured to supply a sixth voltage that is lower than the fourth voltage.

6. The voltage generating circuit of claim 5, further comprising seventh and eighth step-up circuits configured to generate clock signals for the fifth and sixth step-up circuits.

7. The voltage generating circuit of claim 1, further comprising:
a voltage regulator configured to receive the external voltage and to supply the second voltage to the pump circuit.

8. The voltage generating circuit of claim 1, wherein the first and second step-up circuits comprise:
a first capacitor for stepping up a first node in response to a first signal,
a first transistor connected between a first input terminal of the first step-up circuit and the first node,
a second transistor connected between the first node and the output terminal of the first step-up circuit, and having a gate connected to a second node,
a second capacitor for stepping up the second node in response to a second signal,
a third transistor connected between the first node and the second node,
a third capacitor for stepping up a third node in response to a third signal that is complementary to the first signal, a fourth transistor connected between the input terminal of the second step-up circuit and the third node, a fifth transistor connected between the third node and the output terminal of the second step-up circuit, and having a gate connected to a fourth node, a fourth capacitor for stepping up the fourth node in response to a fourth signal that is complementary to the second signal, and a sixth transistor that is connected between the third node and the fourth node.

9. A semiconductor device, comprising:

a memory cell array including a plurality of memory cells; and a voltage generating circuit configured to supply voltages to the memory cell array, the voltage generating circuit first and second step-up circuits including:

a first capacitor for stepping up voltage of a first node in response to a first signal, a first transistor that is connected between a first input node and the first node, a second transistor that is connected between the first node and a first output node and whose gate is connected to a second node, a second capacitor for stepping up voltage of the second node in response to a second signal, a third transistor that is connected between the first node and the second node, a third capacitor for stepping up voltage of a third node in response to a third signal complementary to the first signal, a fourth transistor that is connected between a second input node and the third node, a fifth transistor that is connected between the third node and the second output node and whose gate is connected to a fourth node, a fourth capacitor for stepping up voltage of the fourth node in response to a fourth signal complementary to the second signal, and a sixth transistor that is connected between the third node and the fourth node, wherein the second output node is connected to a gate of the third transistor, and the first output node is connected to a gate of the sixth transistor.

10. The semiconductor device of claim 9, wherein the voltage generating circuit further includes a clock driver for generating the first, second, third, and fourth signals.

11. The semiconductor device of claim 10, wherein the voltage generating circuit further includes:

third and fourth step-up circuits, each having first and second input terminals and an output terminal and configured to increase a voltage level of an input signal supplied through the first input terminal and output the signal with the increased voltage level through the output terminal, wherein the first input terminal of the third step-up circuit is connected to the first output node and the first input terminal of the fourth step-up circuit is connected to the second output node, and the second input terminal of the third step-up circuit is connected to the output terminal of the fourth step-up circuit and the second input terminal of the fourth step-up circuit is connected to the output terminal of the third step-up circuit.

12. The semiconductor device of claim 11, wherein the voltage generating circuit further includes:

fifth and sixth step-up circuits, each having first and second input terminals and an output terminal and configured to increase a voltage level of an input signal supplied through the first input terminal and output the signal with the increased voltage level through the output terminal, wherein the first input terminal of the fifth step-up circuit is connected to the output terminal of the third step-up circuit and the first input terminal of the sixth step-up circuit is connected to the output terminal of the fourth step-up circuit, and the second input terminal of the fifth step-up circuit is connected to the output terminal of the sixth step-up circuit and the second input terminal of the sixth step-up circuit is connected to the output terminal of the fifth step-up circuit.

13. The semiconductor device of claim 12, wherein the voltage generating circuit further includes:

seventh and eighth step-up circuits configured to generate clock signals for the fifth and sixth step-up circuits.

14. The semiconductor device of claim 13, wherein the voltage generating circuit further includes:

a first step down regulator connected to the output terminals of the third and fourth step-up circuits and configured to supply a first output voltage; and a second step down regulator connected to the output terminals of the fifth and sixth step-up circuits and configured to supply a second output voltage.

15. The semiconductor device of claim 9, wherein the voltage generating circuit further includes:

a voltage generator configured to receive an external voltage and generate an output voltage; and a voltage regulator configured to receive the external voltage and to supply an input voltage to the first and second step-up circuits.

16. A method of generating voltages for a semiconductor device with a voltage generating circuit having first and second step-up circuits, each having first and second input terminals and an output terminal, said method comprising:

increasing a voltage level of an input signal supplied through the first input terminal of the first step-up circuit to generate a first output signal;

increasing a voltage level of an input signal supplied through the first input terminal of the second step-up circuit to generate a second output signal;

supplying the first output signal as an input signal to the second input terminal of the second step-up circuit; and supplying the second output signal as an input signal to the second input terminal of the first step-up circuit.

17. The method of claim 16, wherein the voltage generating circuit further includes third and fourth step-up circuits, each having first and second input terminals and an output terminal, said method comprising:

increasing a voltage level of the first output signal which is supplied as input signal to the first input terminal of the third step-up circuit to generate a third output signal;

increasing a voltage level of the second output signal which is supplied as an input signal to the first input terminal of the fourth step-up circuit to generate a fourth output signal;

supplying the third output signal as an input signal to the second input terminal of the fourth step-up circuit; and supplying the fourth output signal as an input signal to the second input terminal of the third step-up circuit.

18. The method of claim 17, wherein the voltage generating circuit further includes fifth and sixth step-up circuits, each having first and second input terminals and an output terminal, said method comprising:

increasing a voltage level of the third output signal which is supplied as input signal to the first input terminal of the fifth step-up circuit to generate a fifth output signal;

increasing a voltage level of the fourth output signal which is supplied as an input signal to the first input terminal of the sixth step-up circuit to generate a sixth output signal;

supplying the fifth output signal as an input signal to the second input terminal of the sixth step-up circuit; and supplying the sixth output signal as an input signal to the second input terminal of the fifth step-up circuit.

19. The method of claim 18, further comprising:

generating a first output voltage from the third and fourth output signals; and generating a second output voltage from the fifth and sixth output signals.

20. The method of claim 19, further comprising:

generating clocks signals for the first, second, third, and fourth step-up circuits with a clock driver; and generating clocks signals for the fifth and sixth step-up circuits from the clock signals and seventh and eight step-up circuits.

* * * * *